US005266751A

United States Patent [19]

Taguchi

[11] Patent Number: 5,266,751

[45] Date of Patent: Nov. 30, 1993

[54] CLUSTER OF LOUDSPEAKER CABINETS HAVING ADJUSTABLE SPLAY ANGLE

[75] Inventor: Kazunori Taguchi, Kanagawa, Japan

[73] Assignee: Yugen Kaisha Taguchi Seisakucho, Kanagawa, Japan

[21] Appl. No.: 906,223

[22] Filed: Jun. 25, 1992

[30] Foreign Application Priority Data

Jun. 25, 1991 [JP] Japan .............................. 3-078264[U]
Jun. 24, 1992 [JP] Japan .............................. 4-054083[U]

[51] Int. Cl.[5] .............................................. H05K 5/00

[52] U.S. Cl. .................................... 181/144; 181/148; 181/199

[58] Field of Search ............... 181/147, 148, 154, 199, 181/144; 381/90, 205

[56] References Cited

U.S. PATENT DOCUMENTS 4,014,597 3/1977 Griffin, Jr. .......................... 181/148
4,179,008 12/1979 LeTourneau ................... 181/199 X
4,190,738 2/1980 Samuels .......................... 181/199 X
4,757,544 7/1988 Guy ...................................... 381/90

FOREIGN PATENT DOCUMENTS 60-33667 10/1985 Japan .

OTHER PUBLICATIONS

Brochure of Martin Audio Limited-"The Revolutionary Martin F2, The World's First Reconfigurable Two-Box System".

*Primary Examiner*—Michael L. Gellner
*Assistant Examiner*—Khanh Dang
*Attorney, Agent, or Firm*—Wenderoth, Lind & Ponack

[57] ABSTRACT

A loudspeaker cabinet cluster comprises a plurality of loudspeaker cabinets which are pivotally connected with each other to adjust their splay angles vertically or horizontally and also to face the baffle boards of the loudspeaker cabinets axially to the desired listener. The single loudspeaker cabinet includes an ordinary audio input for a single channel electrical audio signal. Each loudspeaker cabinet is a hollow quadrangular pyramidal body made of fibrous glass reinforced plastics and a baffle board is fitted integrally into a front opening of the loudspeaker cabinet. The baffle board has a large central opening for accomodating a speaker unit and a plurality of openings at each corner portion formed at a rear top portion thereof, a central opening provided at the flat portion thereof, and connecting metallic frame integrally provided around a front edge portion of the loudspeaker cabinet, the triangular metallic frame having a pair of right angled projections, each projection having a central small opening. A plurality of adjusting plates are mounted at the rear portions of the assembled loudspeaker cabinets, each adjusting piece having a number of small openings provided longitudinally through the adjusting plate at a given interval for allowing intersection of the projection for bridging the opposed rear top portions of the adjacent loudspeakers.

8 Claims, 14 Drawing Sheets

CLUSTER OF LOUDSPEAKER CABINETS HAVING ADJUSTABLE SPLAY ANGLE

1-1. BACKGROUND OF THE INVENTION

This invention relates to a sound reproduction generally, and particularly to a loudspeaker cluster comprising a plurality of splay angle adjustable loudspeaker cabinets, a device for assemblying, hanging or stacking the loudspeaker cabinets, and an apparatus for adjusting splay angle between the loudspeaker cabinets whereby a precise directional characteristic pattern of sound from various speaker cabinets can be produced.

1-2. DESCRIPTION OF THE PRIOR ART

Sound reproduced through a loudspeaker would like the original source, a listener does not want to hear the loudspeaker, but the source accurately and realistically recreated by the loudspeaker.

Sound originating from a sound source is spread as a spherical wave in the air, and it is attenuated in inverse proportion to a square of a distance.

In order to spread uniform sound widely in an auditorium or in the open air, it is necessary to install as many speakers as possible, each loudspeaker being capable of transmitting a high sound level and uniform and wide direction of the sound.

Needless to say, loudspeaker cabinets should be located at higher places to avoid a possible influence of a large audience and of a building and also to increase sound clearness.

A single loudspeaker cannot reproduce the desired sound level and wider coverage so that it must install several loudspeakers, and it has to deploy several to several tens of loudspeakers for a large audience between thousands and scores thousands of people.

(1) In practise, a plurality of loudspeaker cabinets are deployed in a fanwise or spherical shape in an auditorium in order not to cause phase interference between the sounds from the adjacent loudspeakers.

Conventionally, for large buildings such as a big auditorium, public facility or baseball park, special loudspeaker clusters including a plurality of accurately arranged loudspeakers cabinets are rigidly mounted on the exclusive racks to transmit the desired high level sound.

(2) For small and medium size buildings, loudspeaker cabinets are installed on a base fixed at a wall, ceiling, or rack respectively.

Alternatively, loudspeaker cabinets are located directly and rigidly on the wall, ceiling, beam or rack with bolts, nuts or wires which are fixedly inserted into the desired portions of the loudspeaker cabinets.

(3) For simple buildings, ordinary small speaker cabinets are rigidly fixed on the walls, ceiling or racks with the special brackets or fittings therefor.

To this end, the exclusive releasable hanging and fixing metallic brackets are used together with the ordinary wires, ropes or belts so that the loudspeaker cabinets may be located in the building in a fanwise or spherical shape.

Some exclusive fanwise hanging equipments have been proposed for the upper hanging racks (e.g. ELECTRO VOICE, TURBO SOUND, JBL etc.).

The loudspeaker cabinets are hung rigidly in a fanwise or spherical shape at the brackets with releaseable wires, ropes, belts, catches or fittings.

(4) For provisional acoustical facilities such as a large open-air concert hall or meeting, big loudspeaker cabinets which can be arranged or withdrawn easily have been proposed.

1-3. DISADVANTAGE OF THE PRIOR ART

A plurality of ordinary speaker cabinets are hung in the building such as an auditorium or a concert hall, but they have the following disadvantages.

(a) It needs to prepare various devices to mount several loudspeaker cabinets either in a fanned or spherical shape in the open-air concert hall or room in order to obtain suitable acoustical effect.

To this end, substantially elaborate preparation and careful design are necessary, it is very difficult to increase the number of the loudspeaker and also to adjust them after mounting, and a staging is required for for this work. In addition, an expensive repair work is sometimes necessary on a large scale, and it should be remembered that each loudspeaker cabinet is rigidly mounted on the racks, thus making it impossible to adjust acoustical directional characteristics.

(b) Sound waves originating from a number of the neighboring loudspeakers interfere with each other to produce phase interference by crossfeed delay between a peak and a dip of a sound wave, the more remarkable is the phase interference in the high sound range having a short wavelength, thus giving a big influence to frequency-to-directional characteristics, bringing forth a leaf- or lobe-shaped acoustical directional characteristics and also causing unfavorable influence such as difference of sound clearness at the various locations.

(c) It has been difficult for the conventional devices that the loudspeaker cabinets can be arranged in a fanwise or spherical shape in the large building such as an auditorium, public facility or baseball park in such a manner that all of the central extension lines of the loudspeaker cabinets are converged into a focus.

Additionally, increase and removal works of the new loudspeaker cabinets have been almost impossible.

(d) It is easy to mount the desired number of the loudspeaker cabinets in the medium and small buildings, but the desired sound level and safety of the working could not have been obtained.

(e) Inasmuch as the loudspeaker cabinet has a square or trapezoid shape, it is comparatively easy to install a plurality of the loudspeaker cabinets in a fanwise shape in a simple building, but it requres some specially prepared fittings to hang or to fly them to form a partially spherical surface of the loudspeaker cabinets.

There have been proposed some special brackets to arrange the adjacent loudspeaker cabinets, but it could have been possible to arrange only 2–4 loudspeaker cabinets in a row. Accordingly, in case it is required to have higher sound level, it needs to replace the loudspeaker cabinets which have been already installed with the other ones having stronger sound level.

2. SUMMARY OF THE INVENTION

A principal object of this invention is to provide a loudspeaker cluster comprising a plurality of splay angle adjustable loudspeaker cabinets whereby a precise directional pattern of sounds from various adjacent loudspeaker cabinets can be produced to obtain smooth and uniform coverage from the front to back of a tier.

Another object of this invention is to provide a device whereby a desired high level sound effect can be easily obtained from the adjacent loudspeakers in order to minimize a possible phase interference.

Another object of this invention is to provide a device whereby a plurality of splay angle adjustable loudspeaker cabinets can be assembled, hung or stacked at a desired place in a fanwise or spherical shape whereby the desired directional characteristics can be adjusted so as to minimize a possible phase interference of the sounds from the adjacent loudspeaker cabinets.

Another object of this invention is to provide a device for assembling, hanging or stacking the loudspeaker cabinets whereby a plurality of loudspeaker cabinets can be easily assembled, hung or stacked by a rear hinge coupling without any special staging.

Another object of this invention is to provide a device whereby the number of the loudspeaker cabinet can be easily adjusted by either jointing or removing the loudspeaker cabinets to those already installed.

Another object of this invention is to provide a device whereby increasing and removing work for the loudspeaker cabinets can be easily carried out.

Another object of this invention is to provide an apparatus whereby splay angle between the loudspeaker cabinets can be adjusted easily, remotely and safely.

Another object of this invention is to provide a device whereby a plurality of loudspeaker cabinets can be arranged in a row in such a way that the extended central lines of these loudspeaker cabinets are converged into a focus in order to obtain clearness of the sounds from the adjacent loudspeaker cabinets.

Another object of this invention is to provide a device whereby a plurality of loudspeaker cabinets can be easily assembled, hung or stacked in any big, medium or small building.

Still another object of this invention is to provide a device whereby a plurality of loudspeaker cabinets can be arranged at the desired positions at a moderate cost.

3. DESCRIPTION OF THE DRAWINGS

For a fuller understanding of the nature and objects of the present invention, reference should be had to the following detailed description taken in connection with the present drawings, wherein FIG. 1 is a perspective view, seen from the rear side, of an embodiment of this invention which includes a pair of loudspeaker cabinets pivotally coupled with each other to adjust their splay angle;

4. DETAILED DESCRIPTION OF PREFERRED EMBODIMENTS

Figure 1:
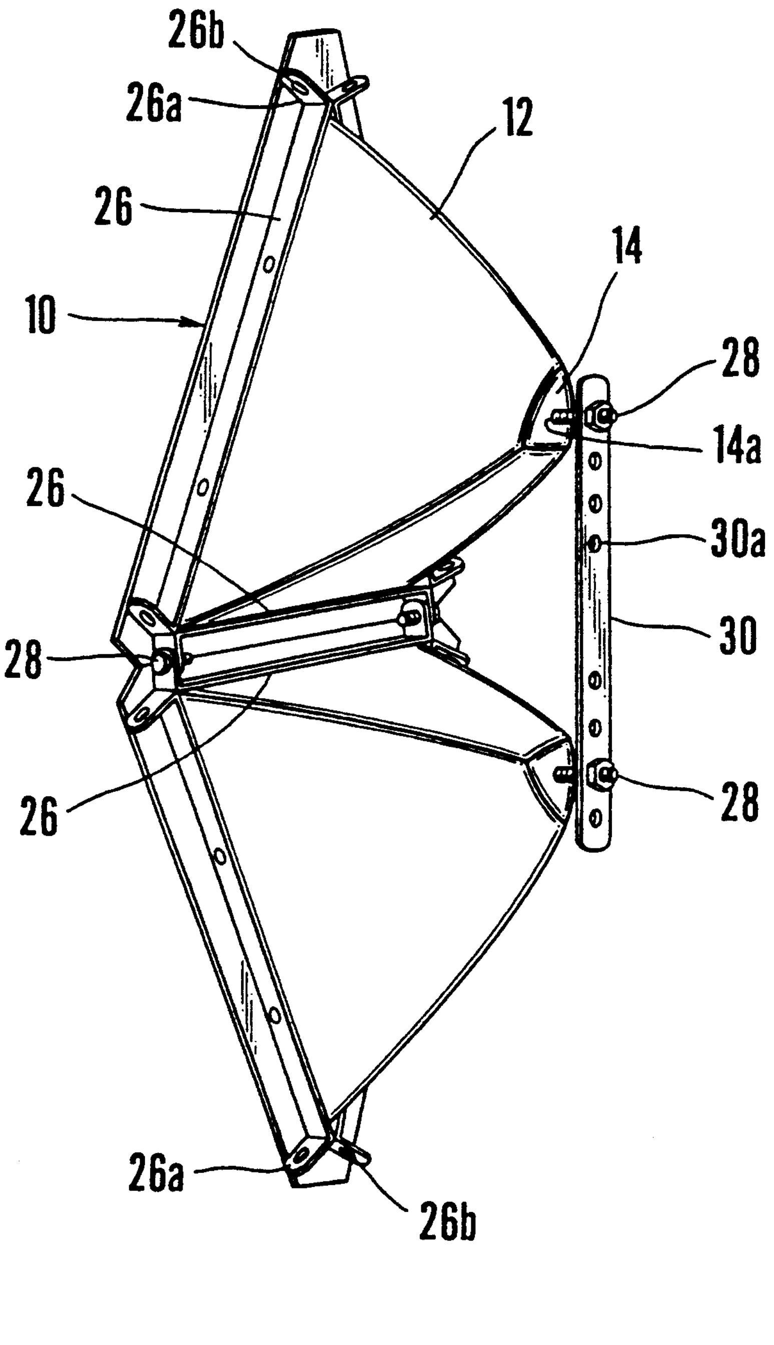

Referring to the drawings, FIG. 1 illustrates a small loudspeaker cabinet cluster 10 comprising a pair of loudspeaker cabinets 12, 12 which are pivotally jointed with each other to adjust their vertical splay angle, as seen from the rear side.

The loudspeaker cabinet 12 of this embodiment is a hollow quadrangular pyramid which is made of fibrous glass reinforced plastics and a baffle board 20 fitted integrally into a front opening **20*a* of the cabinet 12, the baffle board 20 having a large central opening 20*a* for accomodating a speaker 24 and a plurality of openings 20*b*, 20*b* at each corner portion of the baffle board 20**.

Formed at a top rear portion of the loudspeaker cabinet 12 is a flat portion 14, into which an opening **14*a* is centrally provided for allowing insertion of a connecting metallic fitting 16**.

Figure 3:
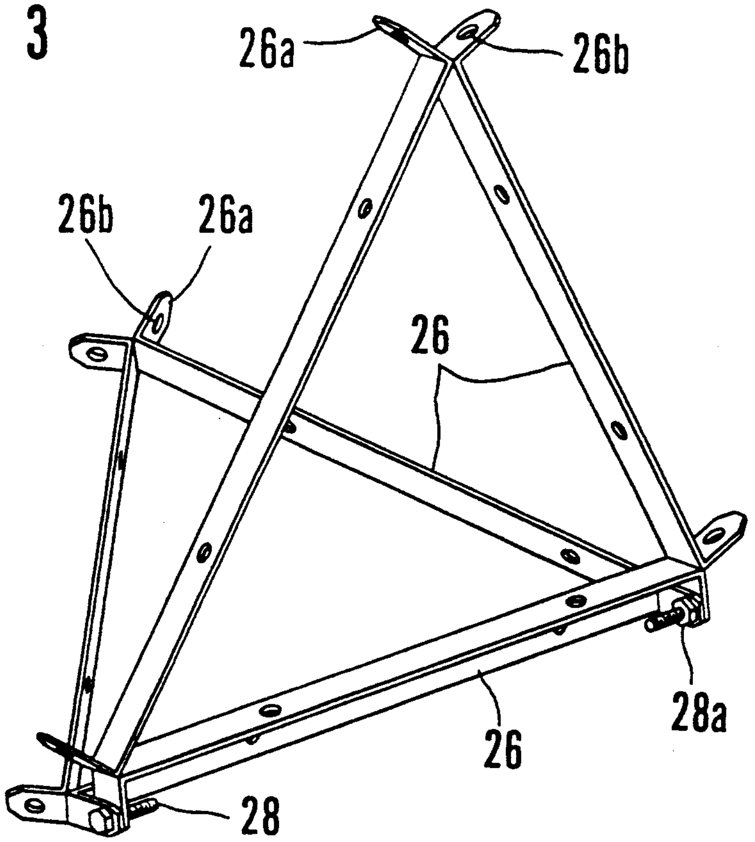
FIG. 3 is a perspective view of metallic frames for assembling the loudspeaker cabinets.

In FIGS. 1 and 3, a plurality of metallic flanges 26, 26, each having a pair of projections **26*a*, 26*a* at both ends, are integrally provided around the front edges portions of the loudspeaker cabinet 12, each projection 26 having a central opening 26*a***.

The connecting metallic fitting 16 is integrally inserted into the central opening **14*a***.

A pair of the loudspeaker cabinets 12, 12 are pivotally coupled at their front edge portions with the projections **26*a*, 26*a* and bolts 28, 28, and a piece of adjusting plate 30 having a number of openings 30*a*, 30*a* is mounted at the adjacent connecting metallic fittings 16, 16, each being penetrated through the openings 30*a*, 30*a*, thus bridging the flat portions 14, 14 of the loudspeaker cabinets 12, 12**.

Figure 2:
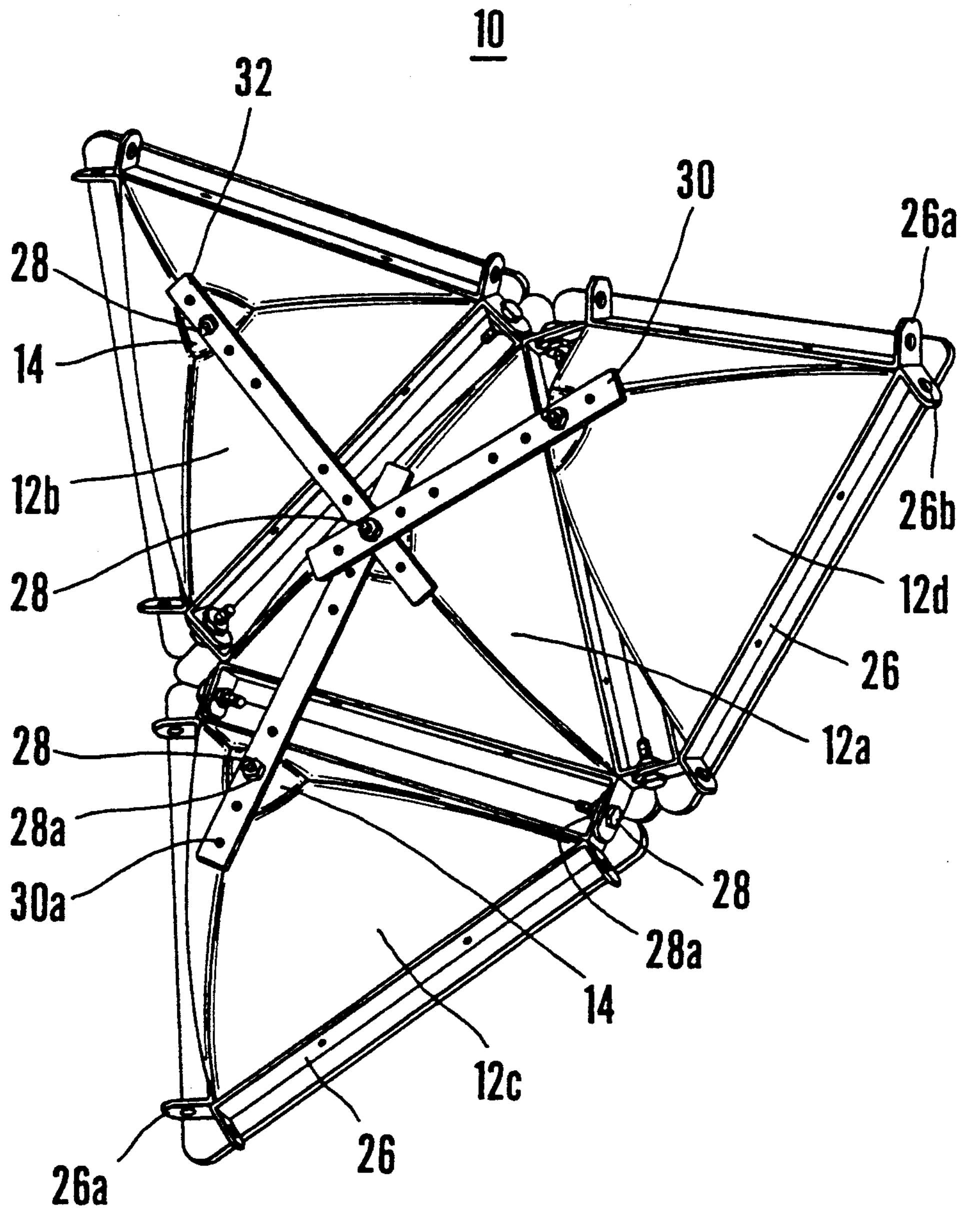
FIG. 2 is a rear perspective view of a loudspeaker cluster which includes four loudspeaker cabinets pivotally jointed with each other to adjust their splay angles.

In FIG. 2, a loudspeaker cluster 10 is shown, wherein three loudspeaker cabinets **12*b*, 12*c* and 12*d* are pivotally mounted around a central loudspeaker cabinet 12*a*, and three adjusting plates 30, 30, 30 are mounted at the three flat portions 14, 14, 14**.

Figure 4:
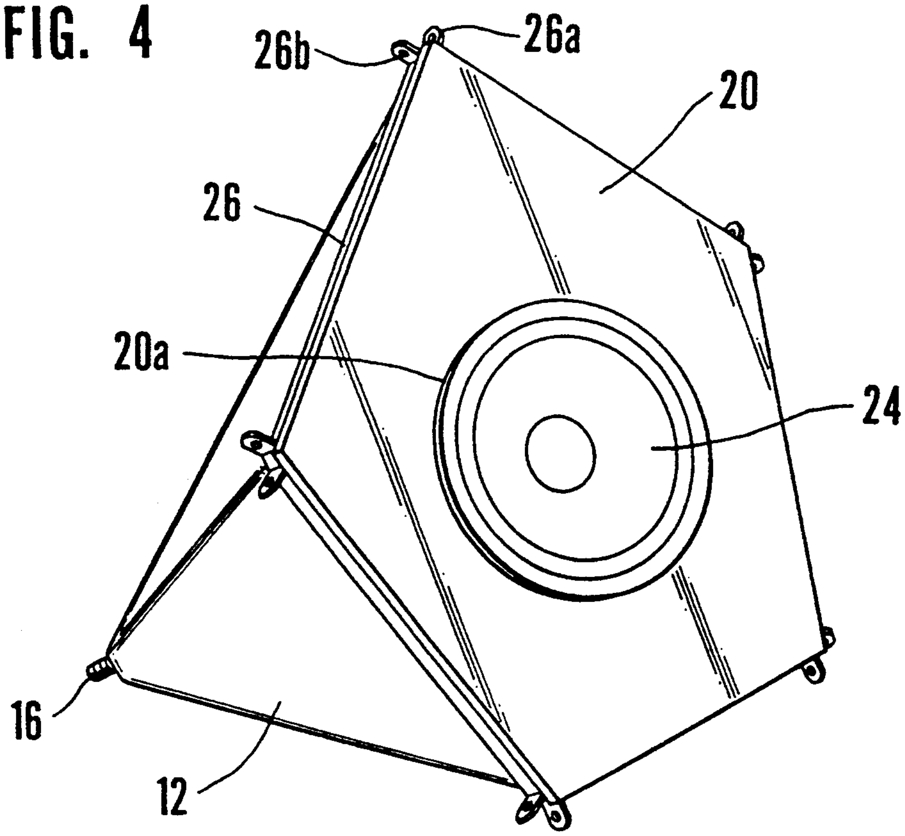
FIG. 4 is a perspective view, seen from the side front of another loudspeaker cabinet.

In FIG. 4, a hexagonal loudspeaker cabinet 12 is shown, which includes a pentagonal baffle board 20 having a central opening **20*a*, into which a loudspeaker 24 is integrally fitted, and a number of metallic frames 26, 26 are integrally provided around the front edges of the loudspeaker cabinet 12**.

Figure 5:
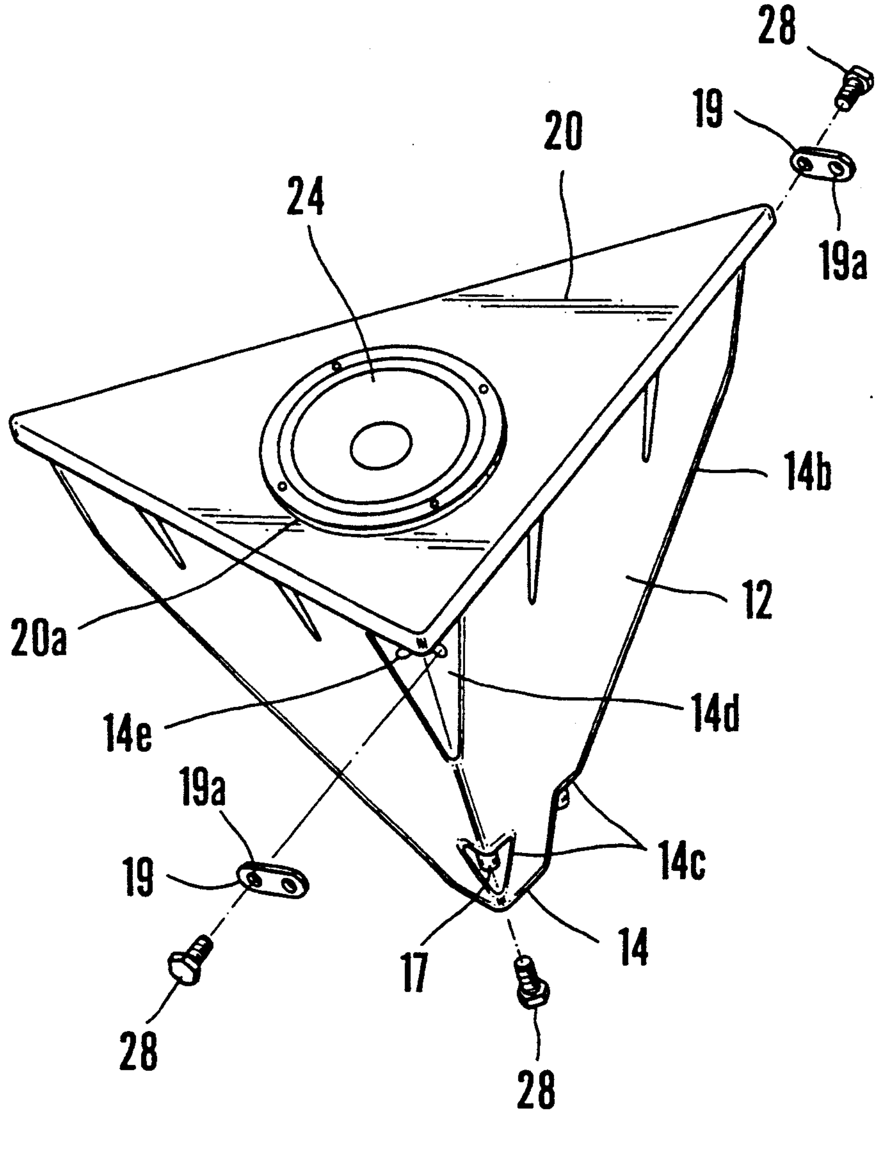
FIG. 5 is a perspective view, seen from the side front of another loudspeaker cabinet, a plurality of metal fittings and bolts for jointing the loudspeaker cabinets.

In FIG. 5 is shown another hollow quadrangular pyramidal loudspeaker cabinet 12 which is made of fibrous glass reinforced plastics. It should be noted that a pair of dent portion 14c, 14d are formed along a ridge 14b near the flat portion 14 and the front edge portion of the cabinet 14, a bushing 17 is inserted into an opening 14a thereof, and a bolt 28 is screwed into each the bushing 15.

Figure 6:
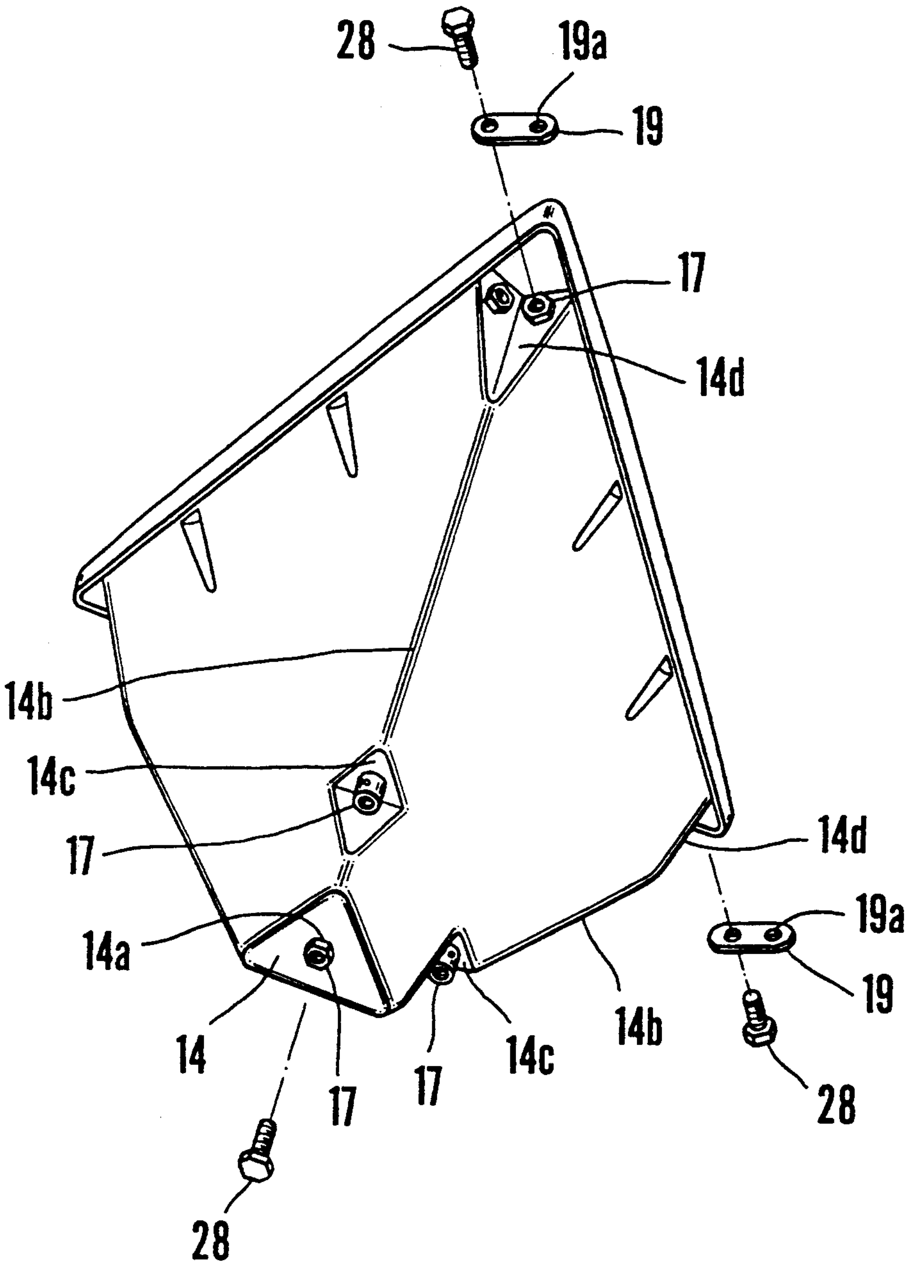
FIG. 6 is a rear perspective of another loudspeaker cabinet, a plurality of metal fittings and bolts.

A rear perspective view of FIG. 5 is shown in FIG. 6, in which a plurality of metallic bushings 15 and bolts 28 are used for jointing the speaker cabinets 12, 12 without the frames 26, 26.

Figure 7:
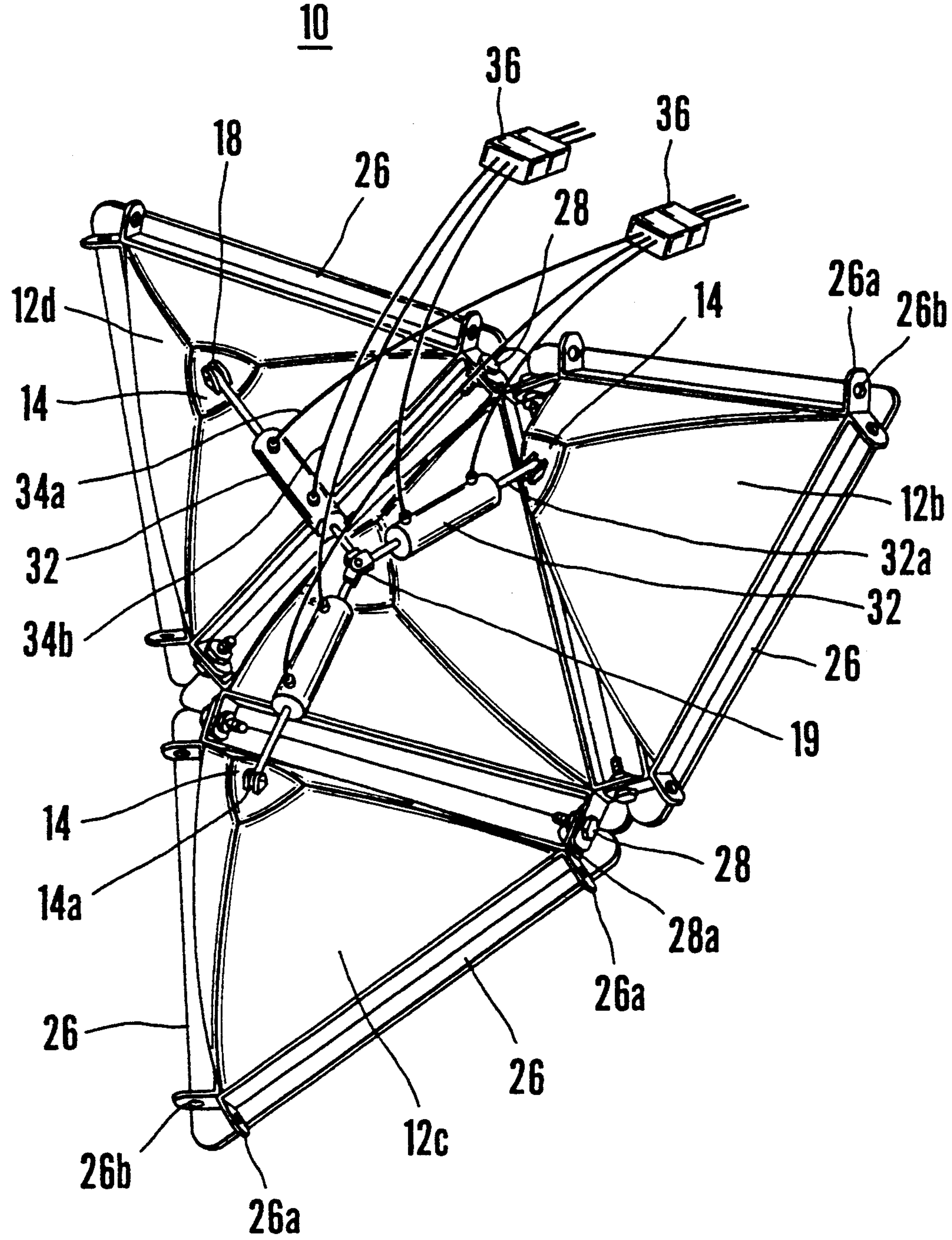
FIG. 7 is a rear perspective of a loudspeaker cluster which comprises four loudspeaker cabinets and their devices for adjusting their splay angles.

In FIG. 7 is shown a rear perspective of a loudspeaker cluster 10 which comprises a central loudspeaker cabinet 12a and three adjacent loudspeaker cabinets 12b, 12c, and 12d pivotally assembled together around the central loudspeaker cabinet 12a. It can be well understood that three hydraulic cylinders 32, 32, 32 are provided at the flat portions 14, 14, 14, each hydraulic cylinder 32 being combined with a pair of hydraulic hoses 34a, 34b for adjusting splay angles between these loudspeaker cabinets 12a, 12b, 12c and 12d in a manner that a precise directional pattern of sounds from the adjacent loudspeaker cabinets can be converged into a focus.

Figure 8:
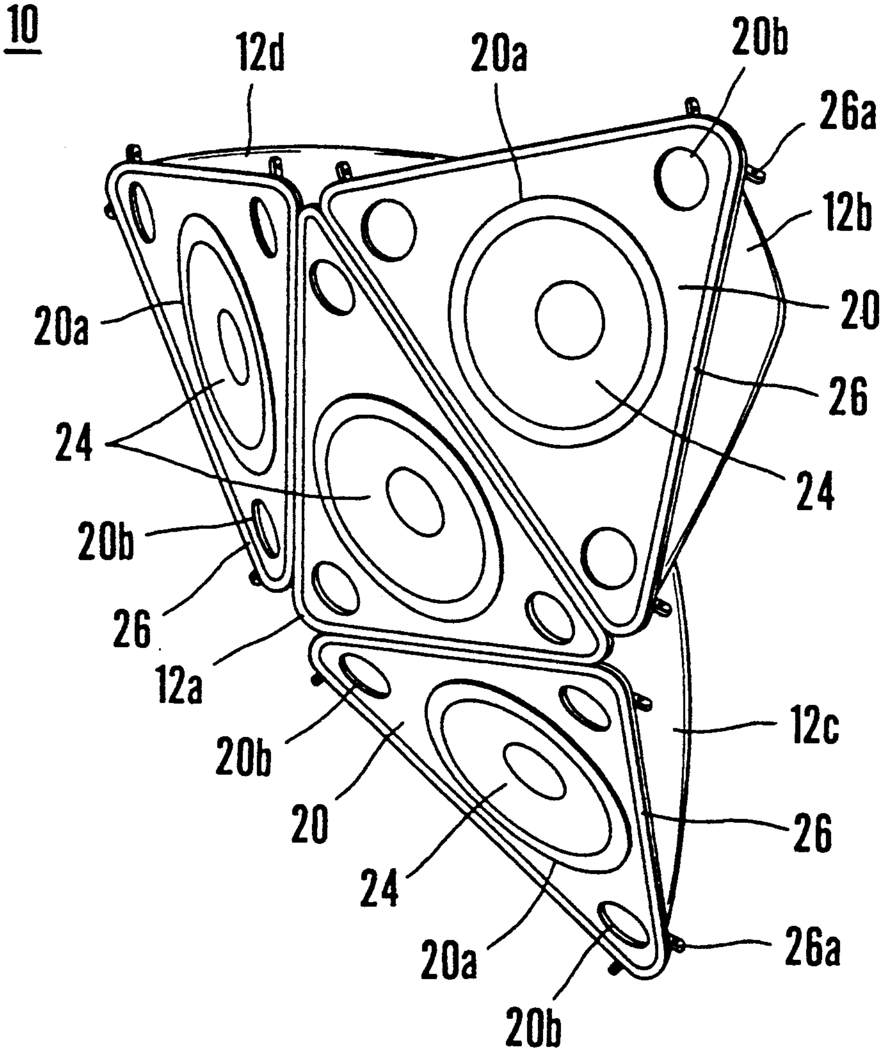
FIG. 8 is a perspective view, seen from the side front, of FIG. 7, their devices for adjusting their splay angles being deleted.

FIG. 8 is a perspective view, seen from the side front, of FIG. 7, wherein the three hydraulic cylinders 32, 32, 32 and their hoses 34a, 34b are deleted, and a large central opening 20a for the loudspeaker 24 and three openings 20b, 20b, 20b are provided at each corner portion of the baffle 20.

Figure 9:
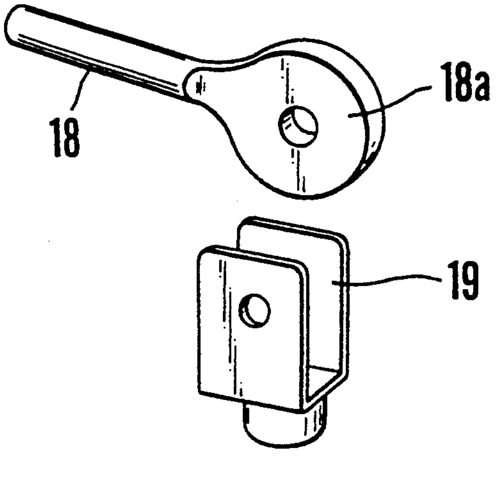
FIG. 9 is an enlarged perspective view of metallic fittings for joining the loudspeaker cabinets.
Figure 10:
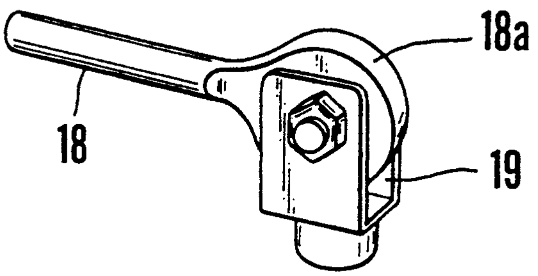
FIG. 10 is an enlarged perspective view of metallic fittings, shown in FIG. 9, which are assembled with each other.

In FIGS. 9 and 10, an enlarged perspective view of metallic fittings 19 are shown for jointing the loudspeaker cabinets 12, 12 with a linkage 40.

Figure 11:
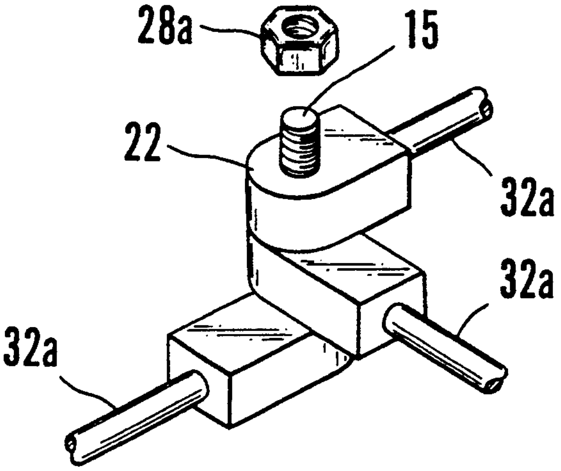
FIG. 11 is an enlarged perspective view of another metallic fittings for joining the loudspeaker cabinets.

In FIG. 11 is shown another metal fitting 19 for jointing three piston rods 32a, 32a, 32a of the three hydraulic cylinders 30, 30, 30 with electromagnetic valves 36, 36. It should be noted that a pair of hoses 34a, 34b are inlet and exhaust ones respectively.

Figure 12:
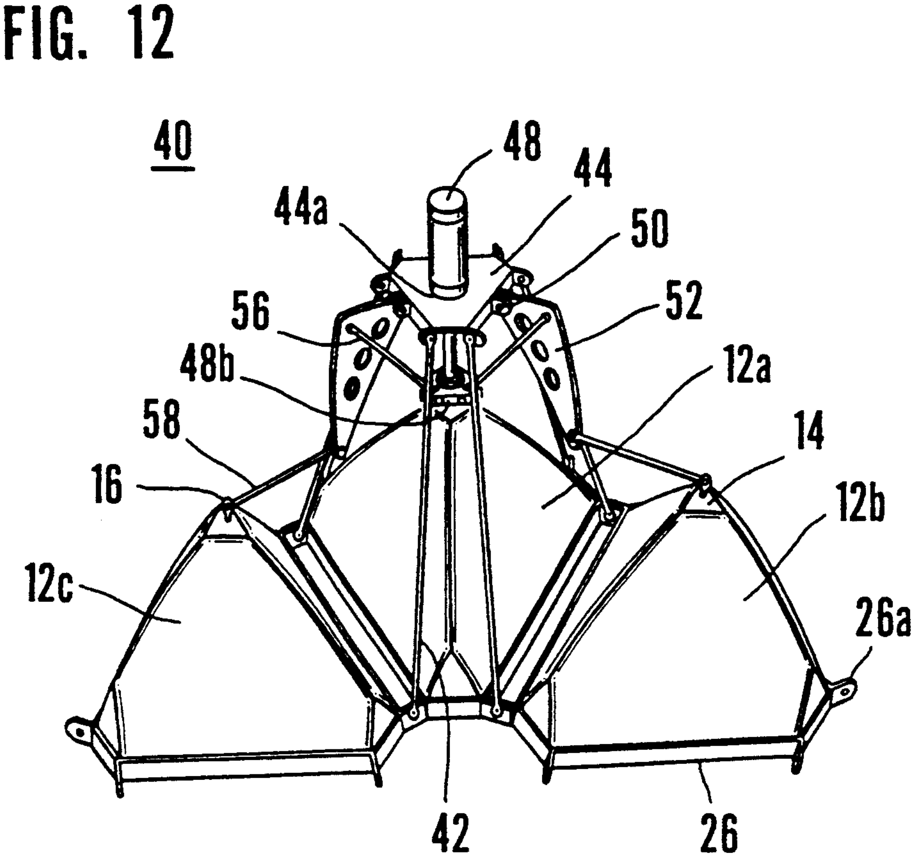
FIG. 12 is a perspective view of a loudspeaker cluster including four loudspeaker cabinets which are pivotally moved to adjust their splay angles.
Figure 13:
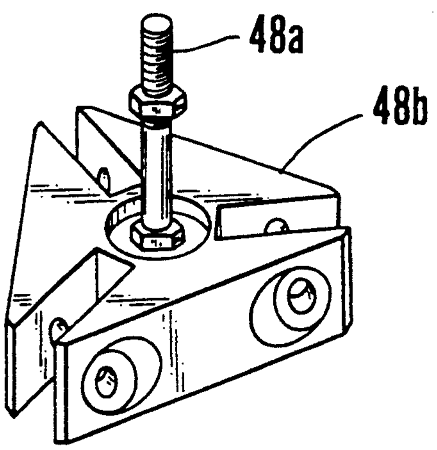
FIG. 13 is a greatly enlarged perspective view of a block for guiding and linking a plurality of operating legs used in FIG. 12.
Figure 14:
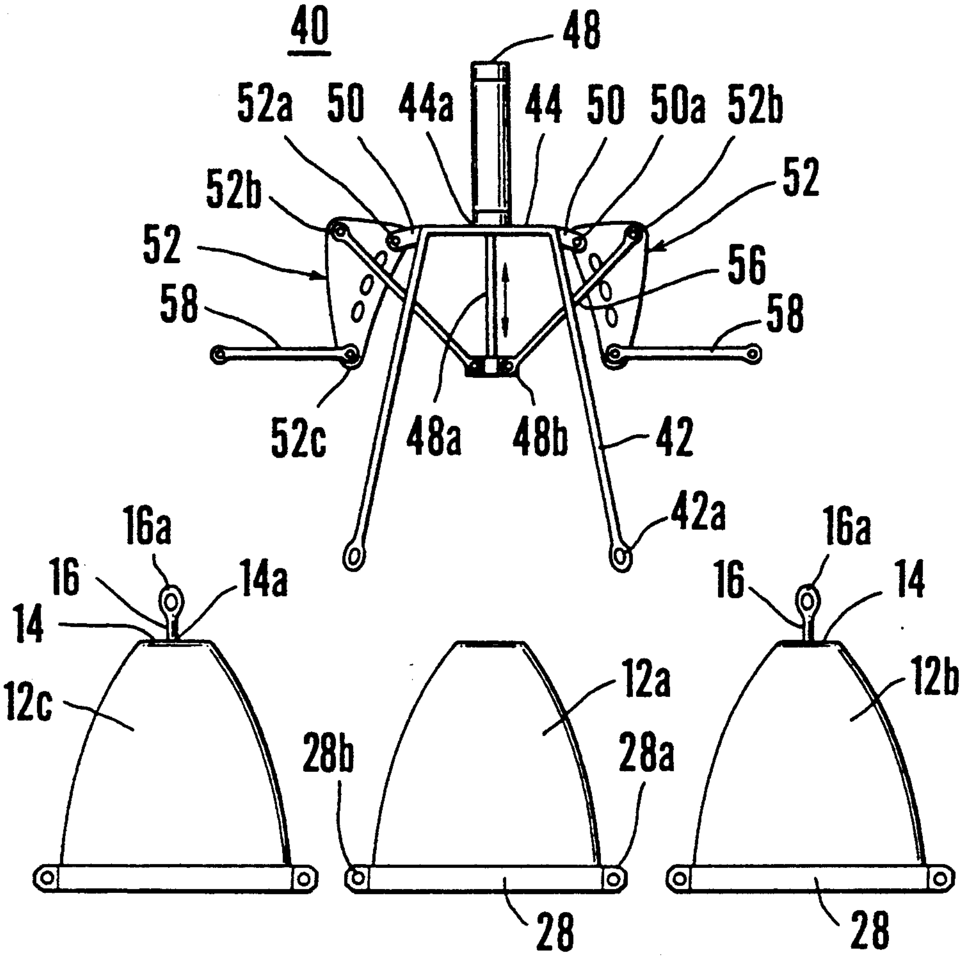
FIG. 14 is a decomposed view

Referring to FIGS. 12, and 14, a loudspeaker cluster 10 comprises four loudspeaker cabinets 12a, 12b, 12cand 12d which are pivotally assembled with each other by the linkage 40 shown in FIG. 14.

FIG. 12 illustrates an enlarged perspective view of a block for guiding and linking a plurality of operating legs used in FIG. 14.

Figure 15:
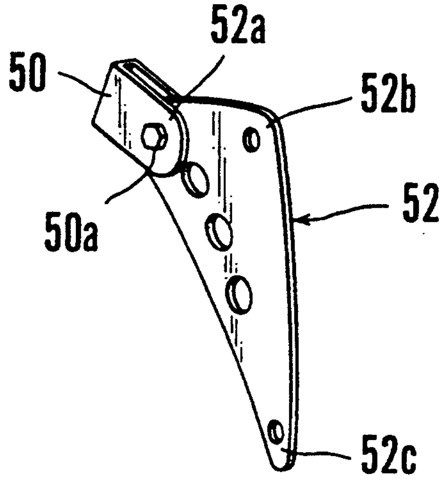
FIG. 15 is a greatly enlarged perspective view of an acute angled triangular operating plate provided at a linkage.
Figure 16:
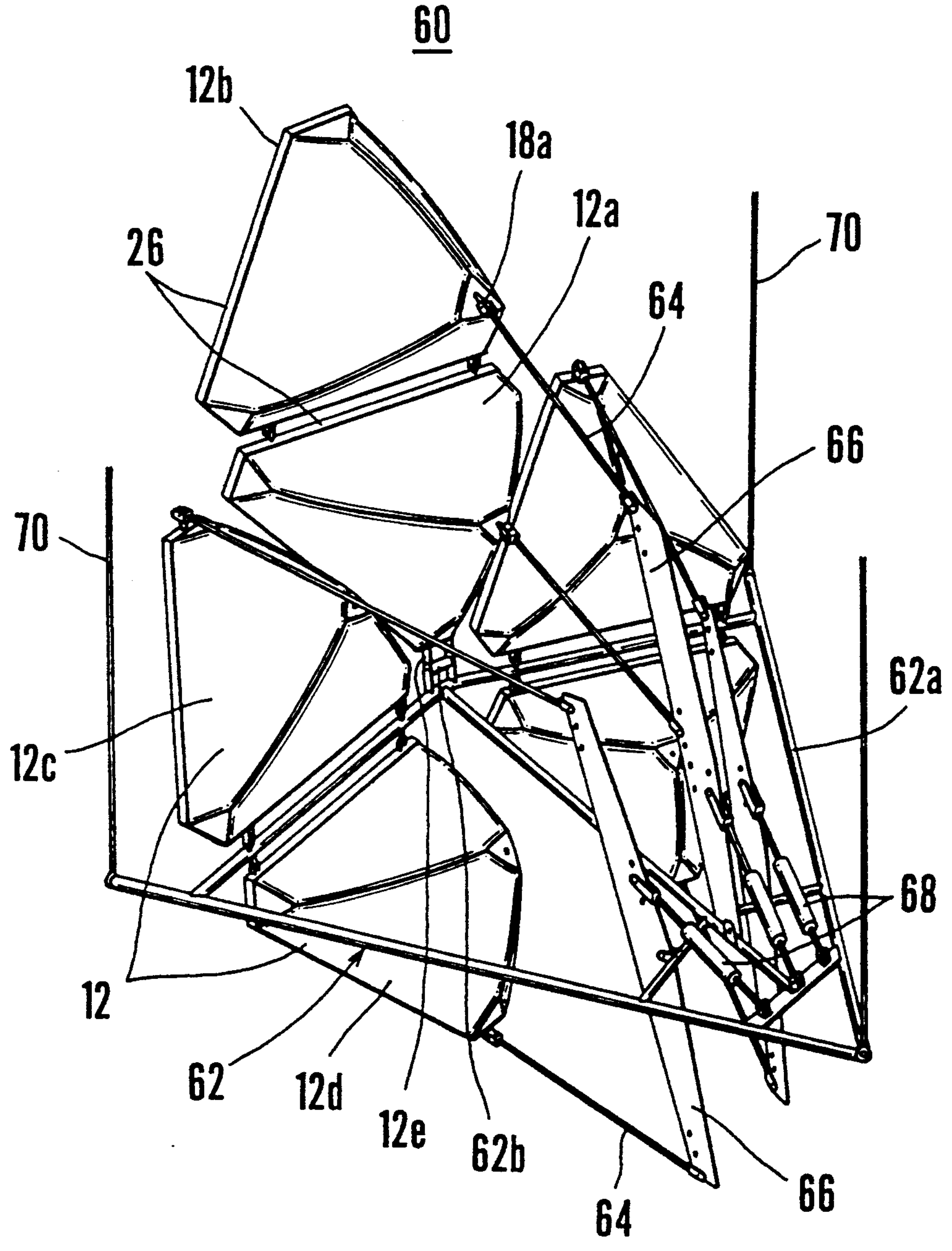
FIG. 16 is a partially perspective view, seen from the rear, of a loudspeaker cluster of this invention.
Figure 17:
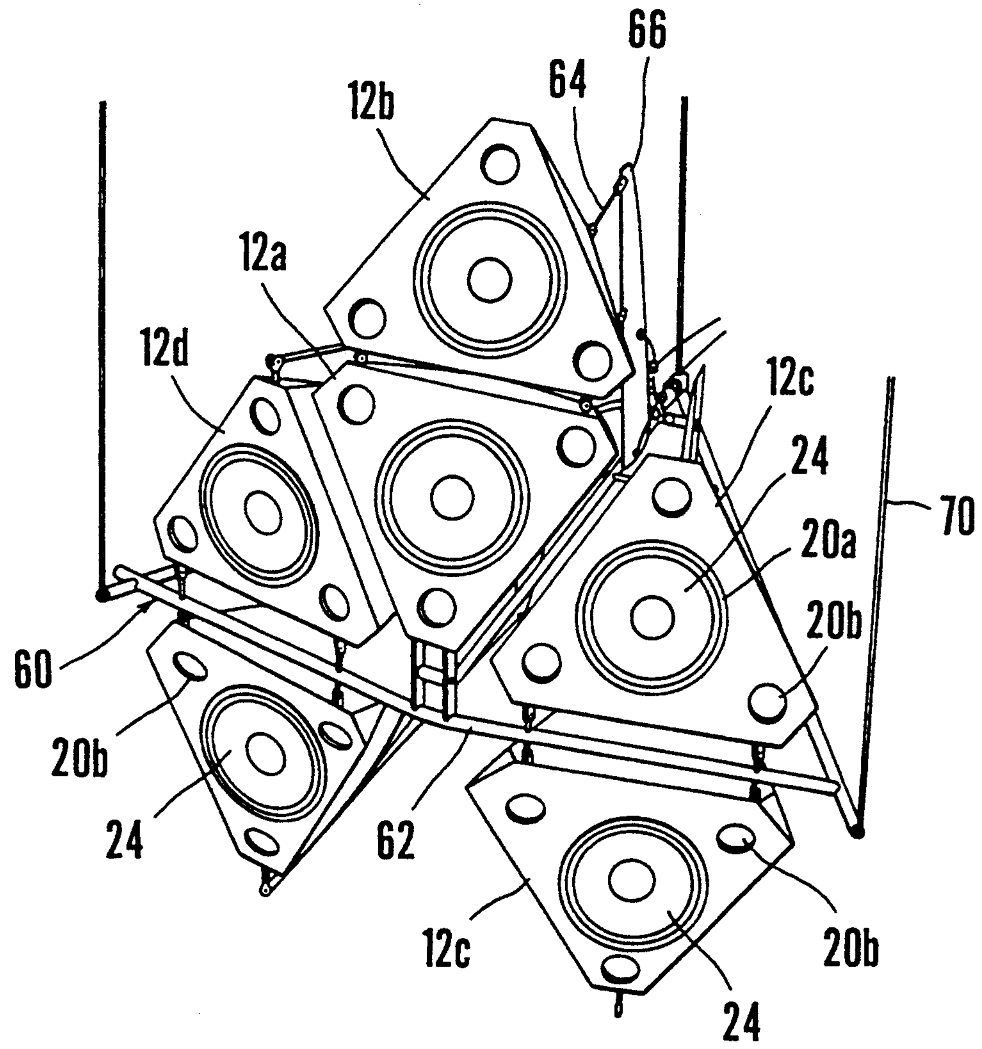
FIG. 17 is a partially perspective view of FIG. 16.

In FIGS. 14 and 15, the linkage 40 includes a base plate 44 having a plurality of long legs 42, 42 extending downwardly and outwardly, a hydraulic cylinder 48 integrally provided into a central opening 44a of the base plate 44, a plurality of trunnions 50, 50 provided around a periphery of the base plate 44, a plurality of the acute angled triangular operating plates 52, 52, each pivotally provided at its obtuse angle corner 52a at each bracket 40 with a bolt 50a, a plurality of medium long legs 56, 56, each being connected between a right angle corner 52b and a periphery of a block 48b provided at a low end portion of a piston rod 48a, and a plurality of short legs 58, 58, each end portion of which being connected at an acute angle corner 52c.

As can be surmised from FIG. 14, three hollow quadrangular pyramidal loudspeaker cabinets 12b, 12c and 12d are pivotally arranged around the central loudspeaker cabinet 12a with their frames 26, 26 pivotally linked with each other, the lower end of the long leg 42 being connected at the pivoted portions of the adjacent frames 26, 26, and also the lower end of the short leg 58 being connected to a ring portion 16a of the connecting metallic fitting 16 mounted fixedly at the flat portion 14 of the adjacent loudspeaker cabinets 12b–12d.

Referring to FIG. 15, the acute angled triangular operating plate 52 is pivotally provided into a slit of the trunnion 50 which is integrally provided at the periphery 44b of the base plate 44.

When the piston rod 48a of the loudspeaker cluster 10 is hydraulically and remotely extended, the adjacent outer loudspeaker cabinets 12b, 12c and 12d around the central cabinet 12a are pivotally widened by the medium long legs 56, the acute angled triangular operating plates 52 and the short legs 58 in such a manner that the central extended lines x, x, x of the cabinets 12a–12d are converged into a focus f.

Alternatively, a motor driven cylinder and a compressed air cylinder (not shown) are provided instead of the hydraulic cylinder 48.

Accordingly, a possible acoustical phase interference of the adjacent loudspeaker cabinets 12a–12d are substantially avoided so as to reduce sound noise.

Referring to FIGS. 16–19, other embodiments of the loudspeaker clusters 10, 10 are illustrated. As particularly shown in FIG. 16, a loudspeaker cluster 60 is mounted on an aluminium rack 62 which is hung by a number of metallic ropes 70, 70. The cluster 60 comprising the loudspeaker cabinets 12a–12d is mounted on the triangular aluminium rack 62 which, in turn, is hung by the metallic ropes 70, 70.

Figure 18:
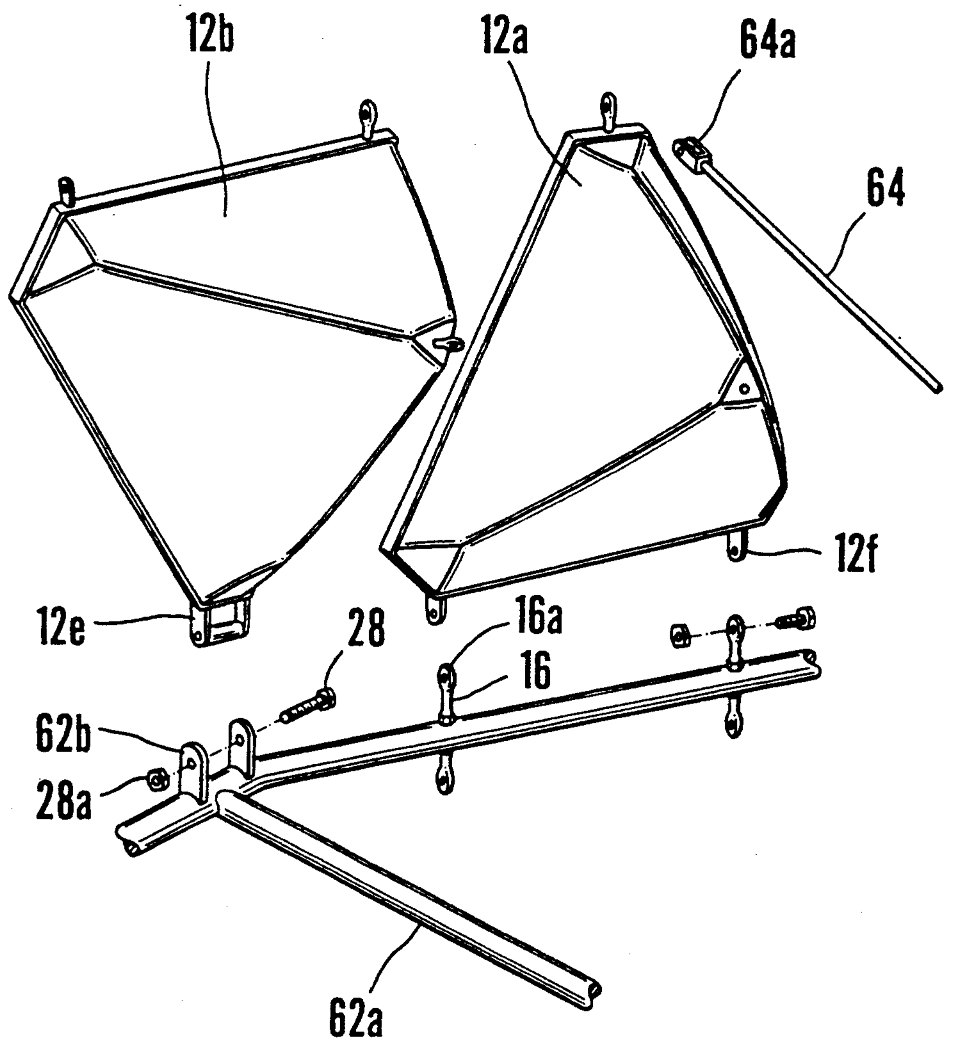
FIG. 18 is a partially decomposed perspective view of FIG. 17.
Figure 19:
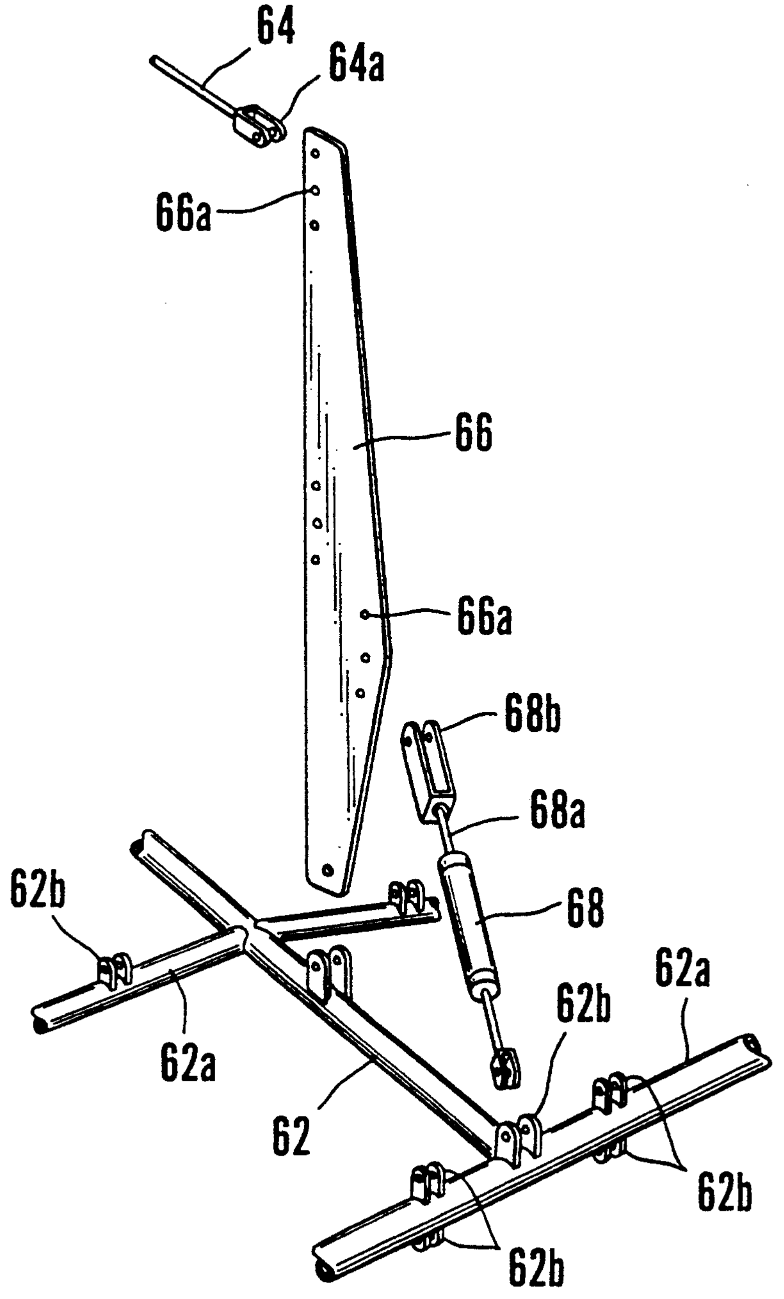
FIG. 19 is also a partially decomposed perspective view, illustrating an operating system to adjust an angle between the adjacent loudspeaker cabinets.

As shown in FIGS. 18 and 19, several lugs 62b and connecting metallic fittings 16, each having a ring-shaped portion 16a, are provided at the aluminium pipes 62a, and also several lugs 62b are provided at the aluminium pipes 62a, the former lugs 62b being used for pivotal connection with a bearing or bracket 12e of the loudspeaker cabinet 12b, while the latter connecting metallic fittings 16 being used for allowing pivotal connection with the projection 26a of the metallic frame 26.

As particularly shown in FIG. 19, a hydraulic cylinder 68 having a pair of piston rod 68a, 68a is pivotally connected between the lugs 62b of the rear aluminium rack 62a and one of the desired openings 66a of a wing-shaped operating plate 66 with the trunnions 68b, 68b, while an upper portion of the wing-shaped operating plate 66 is pivotally connected to a trunnion 64a of a beam 64 which is pivotally connected to the connecting metallic fitting 16 of the loudspeaker cabinet 12a or 12b. It can be seen from the drawings that the trunnion 68b is pivotally connected to the ring-shaped portion 16a of the connecting metallic fitting 16 with a bolt 28 and a nut 16b respectively.

5. ADVANTAGES OBTAINABLE BY THIS INVENTION

It can be easily seen from the foregoing explanation and the accompanying drawings that the loudspeaker cabinets 12a–12d can be assembled with each other, stacked, aligned or hung quite simply and safely without any staging to locate or fly at the desired height to form a partial surface in the building or outdoors, thus facing the baffle boards to the listeners and reducing significantly a possible phase interference of the sounds from the adjacent loudspeaker cabinets.

At the same time, the splay angles between the aligned loudspeaker cabinets can be physically and remotely adjusted to obtain the desired sound level and clearness of the sound.

Although this invention has been described in considerable detail in the above specification, it is not intended that this invention be limited to such detail except as necessitated by the appended claims.

What I claim:

1. A loudspeaker cabinet cluster for providing sound to a defined listening area, said loudspeaker cabinet cluster comprising:

a plurality of loudspeaker cabinets which are pivotally connected with each other to adjust their splay angles vertically or horizontally and also to face the baffle boards of said loudspeaker cabinets axially to the desired listeners;

said loudspeaker cabinet including an ordinary audio input for a single channel electrical audio signal;

said each loudspeaker cabinet being a hollow quadrangular pyramidal body made of fibrous glass reinforced plastics and a baffle board fitted integrally into a front opening of said loudspeaker cabinet, said baffle board having a large central opening for accommodating a speaker unit and a plurality of openings at each corner portion of said baffle board;

said each loudspeaker cabinet having a flat portion formed at a rear top portion thereof, a central opening provided at said flat portion thereof, and a connecting metallic fittings fixedly inserted into said opening;

said each loudspeaker cabinet having a triangular metallic frame integrally provided around a front edge portion of said loudspeaker cabinet, said triangular metallic frame having a pair of right angled projections, each projection having a central small opening;

and a plurality of adjusting plates mounted at the rear portions of the assembled loudspeaker cabinets, each adjusting piece having a number of small openings provided longitudinally through said adjusting plate at a given interval for allowing insertion of the projection for bridging the opposed rear top portions of the adjacent loudspeakers.

2. A loudspeaker cabinet as claimed in claim 1, which comprises a hexagonal loudspeaker cabinet, a pentagonal baffle board having a plurality of metallic frames provided integrally around the front edge portion of said loudspeaker cabinet.

3. A loudspeaker cabinet as claimed in claim 1, which comprises a pair of dent portions provided along a ridge portion of the loudspeaker cabinet, and a bushing integrally screwed into a screwed opening of provided at said flat top portion and said dent portion.

4. A loudspeaker cabinet cluster for providing sound to a defined listening area, said loudspeaker cabinet cluster comprising:

a central loudspeaker cabinet;

a plurality of adjacent loudspeaker cabinets which are pivotally mounted around said central loudspeaker cabinet so as to adjust splay angles vertically or horizontally and also to face the baffle boards of said loudspeaker cabinets axially to the desired listeners; and a plurality of hydraulic adjusting cylinders provided at the rear portions of the assembled loudspeaker cabinets, each hydraulic adjusting cylinder having a pair of piston rods extending from said cylinder, said both ends of said piston rod being connected to the opposed flat top portions of the adjacent loudspeaker cabinets, said each hydraulic cylinder being connected to a pair of hydraulic hoses, each hose having an electromagnetic valve for driving said hydraulic cylinder.

5. A loudspeaker cabinet as claimed in claim 4, wherein said hydraulic adjusting cylinder is replaced with a compressed air cylinder.

6. A loudspeaker cabinet as claimed in claim 4, wherein said hydraulic adjusting cylinder is replaced with a motor driven cylinder.

7. An apparatus for a loudspeaker cabinet cluster for providing sound to a defined listening area, said loudspeaker cabinet cluster comprising:

a central loudspeaker cabinet;

a plurality of adjacent loudspeaker cabinets which are pivotally mounted around said central loudspeaker cabinet so as to adjust splay angles vertically or horizontally and also to face the baffle boards of said loudspeaker cabinets axially to the desired listeners; and a linkage which comprises a base plate having a plurality of long legs extending downwardly and outwardly, a hydraulic cylinder integrally provided into a central opening of said base plate, a plurality of trunnions provided around a periphery of said base plate, a plurality of acute angled triangular operating plates, each pivotally provided at its obtuse angle corner at each bracket, a plurality of medium long legs, each leg being connected between a right angle corner and a periphery of a block provided at a low end portion of a piston rod, and a plurality of short legs.

8. An apparatus for stacking and hanging a loudspeaker cabinet cluster for providing sound to a defined listening area, said loudspeaker cabinet cluster comprising:

a central loudspeaker cabinet mounted on a light metallic rack;

a plurality of adjacent loudspeaker cabinets which are pivotally mounted around said central loudspeaker cabinet and also on or beneath said metallic rack so as to adjust splay angles vertically or horizontally;

a number of hydraulic cylinders provided on said rack to adjust splay angle between the neighboring loudspeaker cabinets; and a number of metallic ropes for hanging said rack at the desired height and locations.

* * * * *